(12) United States Patent
Ohta et al.

(10) Patent No.: US 7,060,960 B2
(45) Date of Patent: Jun. 13, 2006

(54) SOLID-STATE IMAGING DEVICE AND METHOD OF MANUFACTURING THE SAME

(75) Inventors: Sougo Ohta, Kobe (JP); Mikiya Uchida, Kyoto (JP); Yoshiyuki Matsunaga, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 215 days.

(21) Appl. No.: 10/727,676

(22) Filed: Dec. 4, 2003

(65) Prior Publication Data

US 2004/0164227 A1 Aug. 26, 2004

(30) Foreign Application Priority Data

Feb. 21, 2003 (JP) .............................. 2003-044817

(51) Int. Cl.
  H03F 3/08   (2006.01)
  H01L 27/00  (2006.01)
  H01L 31/00  (2006.01)

(52) U.S. Cl. ............................... 250/214.1; 250/208.1; 257/446

(58) Field of Classification Search ............. 250/208.1, 250/214.1; 257/447, 446
See application file for complete search history.

(56) References Cited

U.S. PATENT DOCUMENTS

| 4,471,525 | A | * | 9/1984 | Sasaki ........................ 438/431 |
| 5,291,049 | A | * | 3/1994 | Morita ........................ 257/335 |
| 5,719,626 | A | * | 2/1998 | Yoneyama et al. ......... 348/301 |
| 5,801,082 | A | * | 9/1998 | Tseng ........................... 438/424 |
| 6,118,142 | A | * | 9/2000 | Chen et al. .................. 257/232 |
| 6,281,081 | B1 | * | 8/2001 | Chien et al. ................ 438/296 |
| 6,642,087 | B1 | * | 11/2003 | Nozaki et al. .............. 438/149 |
| 2001/0025970 | A1 | | 10/2001 | Nozaki et al. .............. 257/255 |
| 2004/0094784 | A1 | * | 5/2004 | Rhodes et al. .............. 257/291 |

FOREIGN PATENT DOCUMENTS

| JP | 2001-345439 | 12/2001 |
| JP | 2004-39832 | 2/2004 |
| KR | 2003-0001795 | 1/2003 |

* cited by examiner

*Primary Examiner*—Thanh X. Luu
*Assistant Examiner*—Stephen Yam
(74) *Attorney, Agent, or Firm*—Hamre, Schumann, Mueller & Larson, P.C.

(57) ABSTRACT

A solid-state imaging device that achieves a reduction in variations appearing on a reproducing screen is provided. The solid-state imaging device includes a plurality of pixel cells that are laid out in matrix form on a semiconductor substrate and a driving unit that is provided to drive the plurality of pixel cells. Each of the plurality of pixel cells includes a photodiode, a MOS transistor, and an element isolating portion 2 that is formed so that the photodiode and the MOS transistor are isolated from each other. The element isolating portion 2 is formed of a STI (Shallow Trench Isolation) that is a grooved portion of the semiconductor substrate. In the semiconductor substrate 7, a STI leakage stopper 1 in which an impurity of a conductive type opposite to a conductive type of source/drain regions in the MOS transistor is introduced is formed to enclose side walls and a bottom face of the element isolating portion 2.

14 Claims, 14 Drawing Sheets

Cross section AA

Cross section AA

Cross section PP

SOLID-STATE IMAGING DEVICE AND METHOD OF MANUFACTURING THE SAME

BACKGROUND OF THE INVENTION

1. Field of the Invention

The present invention relates to a solid-state imaging device including an amplification-type MOS transistor and a method of manufacturing the same.

2. Related Background Art

In recent years, attention has been drawn to a solid-state imaging device including an amplification-type MOS transistor. In such a solid-state imaging device, for each pixel, a signal detected by a photodiode is amplified by a MOS transistor, and the device is characterized by its high sensitivity.

FIG. 10 is a circuit diagram showing a configuration of a conventional solid-state imaging device 90. The solid-state imaging device 90 includes a plurality of pixel cells 96 laid out in matrix form on a semiconductor substrate 7. Each of the pixel cells 96 includes a photodiode 3 that converts incident light into a signal charge and stores the signal charge. In each of the pixel cells 96, a transfer transistor 4 for reading out the signal charge stored in the photodiode 3 is provided.

Each of the pixel cells 96 includes an amplify transistor 14. The amplify transistor 14 amplifies the signal charge read out by the transfer transistor 4. In each of the pixel cells 96, a reset transistor 15 is provided. The reset transistor 15 resets the signal charge read out by the transfer transistor 4.

The solid-state imaging device 90 includes a vertical driving circuit 12. A plurality of reset transistor control lines 111 are connected to the vertical driving circuit 12. The reset transistor control lines 111 are arranged at a predetermined distance from and parallel to each other along a horizontal direction so as to be connected respectively to the reset transistors 15 that are provided respectively in the pixel cells 96 laid out along the horizontal direction. A plurality of vertical select transistor control lines 121 further are connected to the vertical driving circuit 12. The vertical select transistor control lines 121 are arranged at a predetermined distance from and parallel to each other along the horizontal direction so as to be connected respectively to vertical select transistors 16 that are provided respectively in the pixel cells 96 laid out along the horizontal direction. The vertical select transistor control lines 121 determine from which row signals are to be read out.

The respective sources of the vertical select transistors 16 are connected to vertical signal lines 61. A load transistor group 17 is connected to one end of each of the vertical signal lines 61. The other end of each of the vertical signal lines 61 is connected to a row signal storing part 18. The row signal storing part 18 includes a switching transistor for capturing signals to be obtained from one row. A horizontal driving circuit 13 is connected to the row signal storing part 18.

FIG. 11 is a timing chart for explaining an operation of the conventional solid-state imaging device 90.

When a row selection pulse 101-1 for increasing the power level of the vertical select transistor control line 121 is applied, the vertical select transistors 16 in a selected row are activated, so that the amplify transistors 14 in the selected row and the load transistor group 17 form a source follower circuit.

While the row selection pulse 101-1 is at a high level, a reset pulse 102-1 for increasing the power level of the reset transistor control line 111 is applied so as to reset a potential of a floating diffusion layer to which a gate of each of the amplify transistors 14 is connected. Then, while the row selection pulse 101-1 is at a high level, a transfer pulse 103-1 is applied so as to increase the power level of a transfer transistor control line. This allows a signal charge stored in each of the photodiodes 3 to be transferred to the floating diffusion layer.

At this time, the amplify transistors 14 connected to the floating diffusion layer have a gate voltage equal to the potential of the floating diffusion layer. A voltage that is substantially equal to this gate voltage appears at the vertical signal lines 61. Then, a signal based on the signal charge stored in each of the photodiodes 3 is transferred to the row signal storing part 18.

Next, the horizontal driving circuit 13 generates a column selection pulses 106-1-1, 106-1-2, . . . one after another and extracts the signals that have been transferred to the row signal storing part 18 as an output signal 107-1 corresponding to the signals obtained from one row.

FIG. 12 is a plan view for explaining a configuration of the photodiode 3 and the transfer transistor 4 that are provided in the pixel cell 96 of the conventional solid-state imaging device 90. FIG. 13 is a cross sectional view taken along a plane PP shown in FIG. 12.

Between the photodiode 3 and the transfer transistor 4, an element isolating portion 92 formed of a STI (Shallow Trench Isolation) that is a grooved portion of the semiconductor substrate 7 is formed so that the photodiode 3 and the transfer transistor 4 are isolated from each other.

The transfer transistor 4 includes gate electrodes 53 formed on the semiconductor substrate 7 and source/drain regions 5, each of which is formed on a surface of the semiconductor substrate 7 on each side of the respective gate electrodes 53.

An element isolating portion 92A is formed so that the photodiode 3 is isolated from another photodiode 3 contained in the pixel cell 96 adjacent to the pixel cell 96 containing the photodiode 3.

FIG. 14 is a cross sectional view for explaining a configuration of the element isolating portion 92. FIG. 15 is a graph showing a defect density obtained along a plane XY shown in FIG. 14. FIG. 16 is schematic sectional view for explaining a configuration of the element isolating portion 92 and the photodiode 3.

The photodiode 3 is an embedded photodiode in which a p+ layer 8, an n layer 9 and a p layer 10 are formed in this order starting from a surface side of the semiconductor substrate 7.

One of the reasons for the poor performance of MOS type sensors is that a reverse-direction leakage current 89 flows from the element isolating portion 92 to the photodiode 3 in which a pn junction is established between the p+ layer 8, the n layer 9 and the p layer 10. This reverse-direction leakage current is increased due to a crystal defect and stress caused in the semiconductor substrate 7.

It has been revealed that in the structure of a MOS transistor, a crystal defect and stress are most likely to be caused by the element isolating portions 92 and 92A.

As such a crystal defect, conventionally, a crystal defect 52 that is caused at a corner of the surface of the semiconductor substrate 7 in the vicinity of the element isolating portion 92 has been well known. Further, a crystal defect 53 that is caused on a lower side of the element isolating portion 92 recently has been viewed as a problem.

The crystal defect 52 and the crystal defect 53 as described above have a large size of about not less than 0.5 µm. These defects cause the performance of a MOS transistor to be deteriorated and thus, while being suppressed by annealing or the like in a heating process, have remained as major problems.

As shown in FIG. 15, an interface between the element isolating portion 92 and the semiconductor substrate 7 was analyzed in detail along a cross section XY shown in FIG. 14. The results of the analysis revealed that small defects caused due to the crystal defect 52 and the crystal defect 53 were distributed. These defects are extremely small and thus present no problem in the conventional MOS transistors.

In FIG. 15 as closely seen, an interface defect layer 94 and a STI stress defect layer 95 are observed. The interface defect layer 94 has been well known conventionally and is present in a place that is in contact with the interface between the element isolating portion 92 and the semiconductor substrate 7. The STI stress defect layer 95 is formed conceivably due to stress caused by a STI. Unlike the crystal defect 52 and the crystal defect 53 that are caused locally at ends of a STI due to the above-mentioned stress caused by the STI, the STI stress defect layers 95 are distributed near the interface between the element isolating portion 92 and the semiconductor substrate 7.

The crystal defect 52 and the crystal defect 53 are not necessarily caused at ends of a STI but caused such that these defects, which are several in number, are distributed in a semiconductor chip. In a semiconductor substrate, stress exerted around these defects caused therein is released, resulting even in a phenomenon in which the STI stress defect layer 95 is decreased in size. The cause and effect of this phenomenon is yet to be analyzed definitely, and there are even cases where the phenomenon cannot be observed definitely. The STI stress defect layer 95, while its size may vary, is caused in a place at a distance from the interface of about 0.01 μm, and even at a distance of 0.02 μm when the bottom of the distribution is considered.

In a MOS type solid-state imaging device in which the above-mentioned STI element isolating portions 2 and 2A are provided, the crystal defect 52 and the crystal defect 53 appear on a reproducing screen in the form of several to several thousands of white point defects with large output. The number of such point defects varies depending on how a STI has been formed and the scale of the imaging device.

The STI stress defect layer 95 causes the reverse leakage current 89 to be generated and is observed as small and uneven variations on the reproducing screen.

The conventional problem has been the former, i.e. point defects originating in the crystal defect 52 and the crystal defect 53, which are caused locally. With the recent advances of the digital technologies, it has been possible to correct white flaws originating in the crystal defect 52 and the crystal defect 53 that are caused in small numbers, and thus such point defects no longer have been a serious problem.

However, in order to correct small and uneven variations originating in the STI stress defect layer 95, a large-capacity memory is required to correct the variations caused over the entire screen. This requires a costly system for the correction, which has been disadvantageous.

It is an object of the present invention to provide a high-performance solid-state imaging device that achieves a reduction in variations appearing on a reproducing screen and a method of manufacturing the same.

SUMMARY OF THE INVENTION

A solid-state imaging device according to the present invention includes a plurality of pixel cells that are laid out in matrix form on a semiconductor substrate and a driving unit that is provided to drive the plurality of pixel cells. Each of the plurality of pixel cells includes a photodiode that converts incident light into a signal charge and stores the signal charge, at least one MOS transistor that is provided to read out the signal charge stored in the photodiode, and an element isolating portion that is formed so that the photodiode and each of the at least one MOS transistor are isolated from each other. The element isolating portion is formed of a STI (Shallow Trench Isolation) that is a grooved portion of the semiconductor substrate. In the semiconductor substrate, a STI leakage stopper in which an impurity of a conductive type opposite to a conductive type of source/drain regions in the at least one MOS transistor is introduced is formed to enclose side walls and a bottom face of the element isolating portion forming the grooved portion.

A method of manufacturing a solid-state imaging device according to the present invention is a method of manufacturing the solid-state imaging device according to the present invention. The method comprises the steps of forming a groove by grooving the semiconductor substrate so that the photodiode and each of the at least one MOS transistor are isolated from each other; implanting ions into the groove so that the STI leakage stopper is formed to enclose side walls and a bottom face of the groove; forming the element isolating portion formed of the STI (Shallow Trench Isolation) in the groove; forming the photodiode on the semiconductor substrate after the step of forming the element isolating portion; and forming the at least one MOS transistor on the semiconductor substrate such that each of the at least one MOS transistor is isolated from the photodiode by the element isolating portion.

DETAILED DESCRIPTION OF THE INVENTION

In a solid-state imaging device according to an embodiment of the present invention, a STI leakage stopper in which an impurity of a conductive type opposite to a conductive type of source/drain regions in a MOS transistor is introduced is formed in a semiconductor substrate to enclose side walls and a bottom face of an element isolating portion. Thus, a flow of a leakage current from the element isolating portion to a photodiode is hindered by the STI leakage stopper. As a result, a high-performance solid-state imaging device that achieves a reduction in variations appearing on a reproducing screen can be obtained.

In this embodiment, preferably, the element isolating portion is formed so as to isolate the photodiode from another photodiode contained in a pixel cell adjacent to one of the plurality of pixel cells containing the photodiode.

Preferably, the at least one MOS transistor is a plurality of MOS transistors, and the element isolating portion is formed so that one of the plurality of MOS transistors is isolated from another one of the plurality of MOS transistors.

Preferably, the STI leakage stopper has a thickness of not less than 0.01 µm.

Preferably, the STI leakage stopper has a thickness of not less than 0.02 µm.

The driving unit includes a vertical driving circuit that drives the plurality of pixel cells along a row direction and a horizontal driving circuit that drives the plurality of pixel cells along a column direction.

Preferably, the photodiode is an embedded photodiode in which a p+ layer, an n layer and a p layer are formed in this order starting from a surface side of the semiconductor substrate, and the STI leakage stopper is formed so as to be linked to the p+ layer of the photodiode.

Preferably, a MOS transistor constituting the driving unit is a NMOS transistor.

Preferably, the STI leakage stopper has a thickness that is larger at the bottom face of the element isolating portion than at the side walls of the element isolating portion.

Preferably, the impurity introduced in the STI leakage stopper has a peak concentration of not less than $1 \times E^{17}$ cm$^{-3}$.

Preferably, the impurity introduced in the STI leakage stopper has a peak concentration of not less than $5 \times E^{18}$ cm$^{-3}$.

In a manufacturing method according to this embodiment, ions are implanted into a groove for isolating a photodiode from a MOS transistor so that a STI leakage stopper is formed to enclose side walls and a bottom face of the groove. Thus, a flow of a leakage current from an element isolating portion to the photodiode is hindered by the STI leakage stopper thus formed. As a result, a high-performance solid-state imaging device that achieves a reduction in variations appearing on a reproducing screen can be obtained.

Hereinafter, the present invention will be described by way of the embodiment with reference to the appended drawings.

Figure 1:
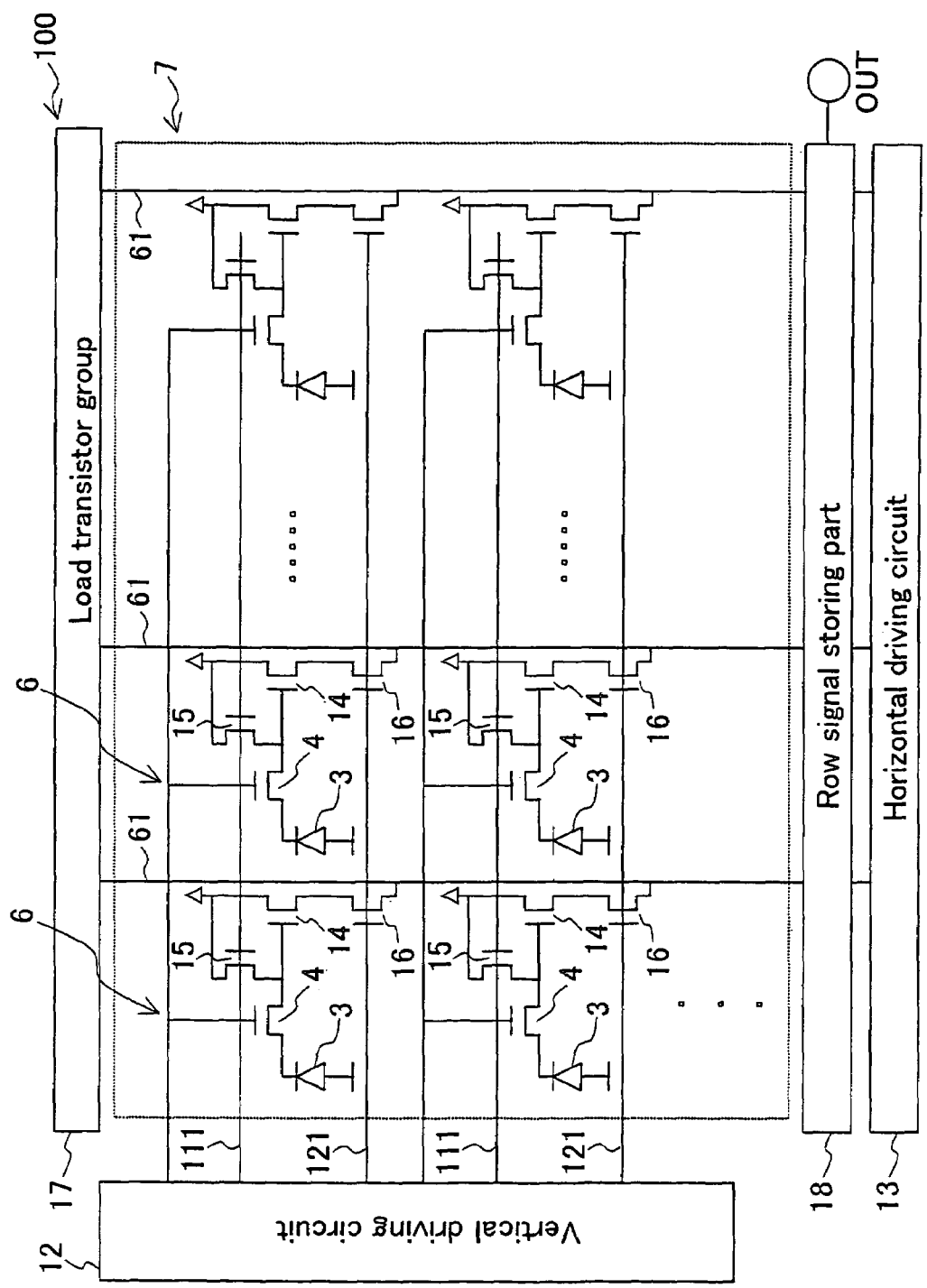
FIG. 1 is a circuit diagram showing a configuration of a solid-state imaging device according to an embodiment of the present invention.

FIG. 1 is a circuit diagram showing a configuration of a solid-state imaging device 100 according to this embodiment.

The solid-state imaging device 100 includes a plurality of pixel cells 6 that are laid out in matrix form on a semiconductor substrate 7. Each of the pixel cells 6 includes a photodiode 3 that converts incident light into a signal charge and stores the signal charge. In each of the pixel cells 6, a transfer transistor 4 for reading out the signal charge stored in the photodiode 3 is provided.

Each of the pixel cells 6 includes an amplify transistor 14. The amplify transistor 14 amplifies the signal charge read out by the transfer transistor 4. In each of the pixel cells 6, a reset transistor 15 is provided. The reset transistor 5 resets the signal charge read out by the transfer transistor 4.

The solid-state imaging device 100 includes a vertical driving circuit 12. A plurality of reset transistor control lines 111 are connected to the vertical driving circuit 12. The reset transistor control lines 111 are arranged at a predetermined distance from and parallel to each other along a horizontal direction so as to be connected respectively to the reset transistors 15 that are provided respectively in the pixel cells 6 laid out along the horizontal direction. A plurality of vertical select transistor control lines 121 further are connected to the vertical driving circuit 12. The vertical select transistor control lines 121 are arranged at a predetermined distance from and parallel to each other along the horizontal direction so as to be connected respectively to vertical select transistors that are provided respectively in the pixel cells 96 laid out along the horizontal direction. The vertical select transistor control lines 121 determine from which row signals are to be read out.

The respective sources of the vertical select transistors are connected to vertical signal lines 61. A load transistor group 17 is connected to one end of each of the vertical signal lines 61. The other end of each of the vertical signal lines 61 is connected to a row signal storing part 18. The row signal storing part 18 includes a switching transistor for capturing signals to be obtained from one row. A horizontal driving circuit 13 is connected to the row signal storing part 18.

Figure 2:
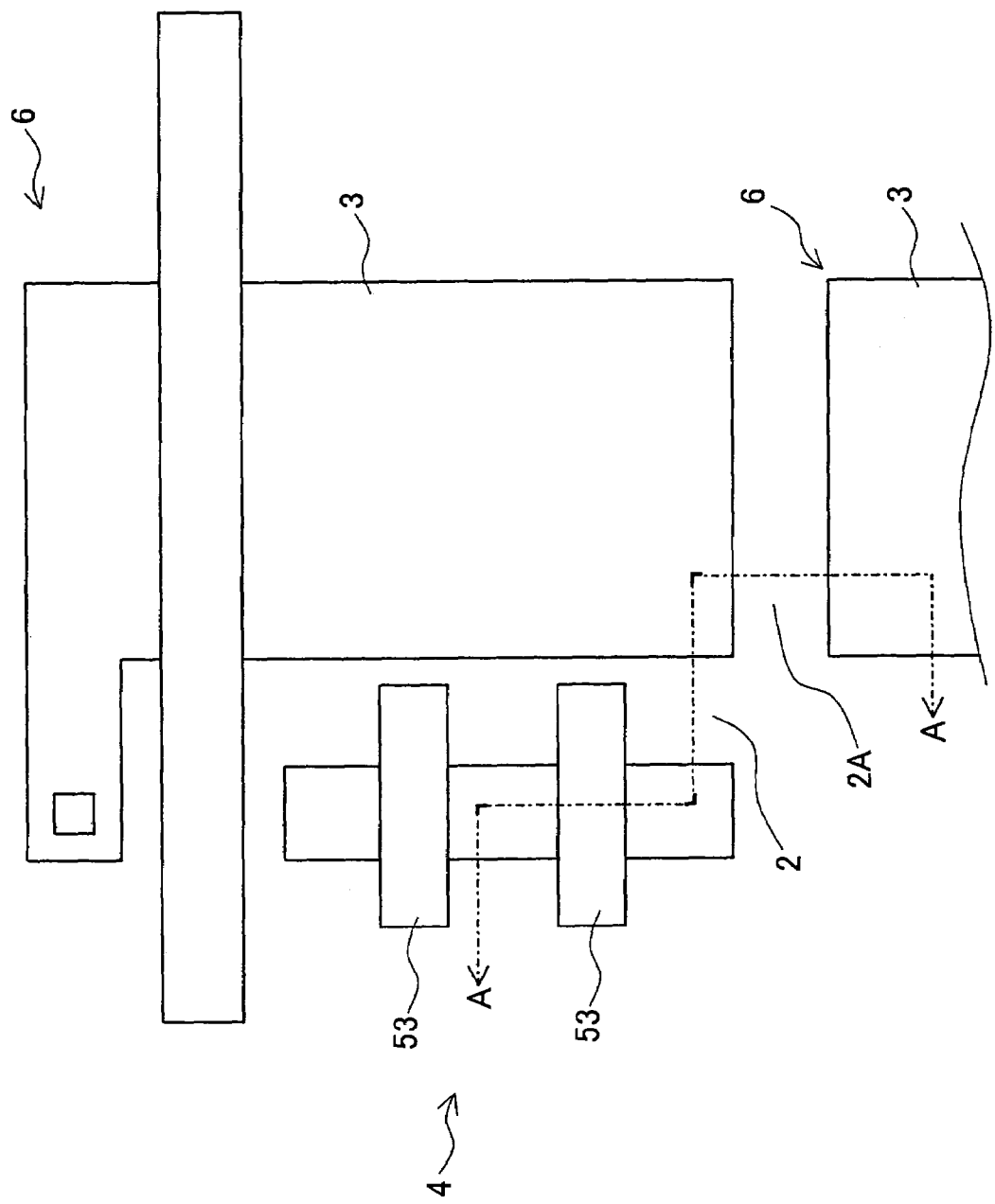
FIG. 2 is a plan view for explaining a configuration of a photodiode and a transfer transistor that are provided in a pixel cell of the solid-state imaging device according to the embodiment of the present invention.
Figure 3:
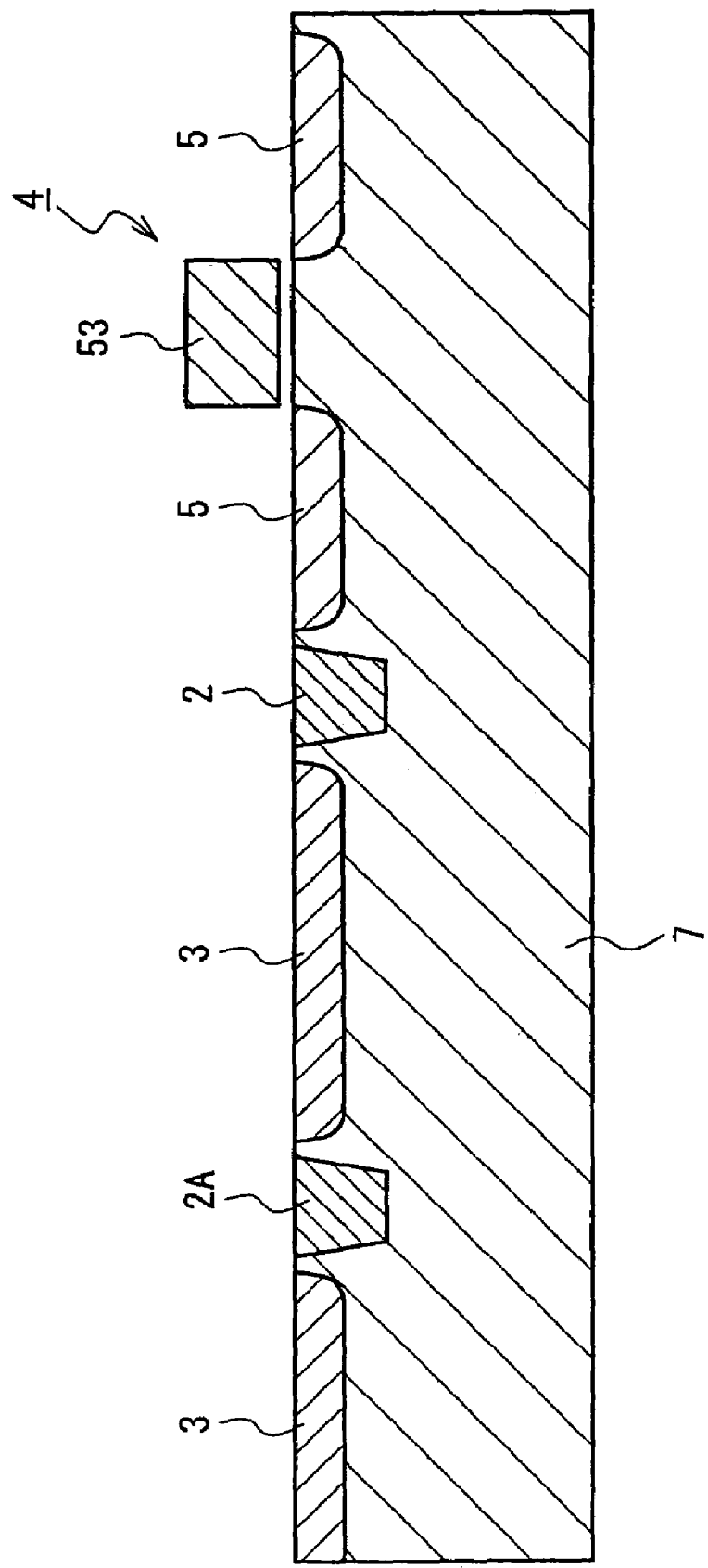
FIG. 3 is a cross sectional view taken along a plane AA shown in FIG. 2.

FIG. 2 is a plan view for explaining a configuration of the photodiode 3 and the transfer transistor 4 that are provided in the pixel cell 6 of the solid-state imaging device 100 according to this embodiment. FIG. 3 is a cross sectional view taken along a plane AA shown in FIG. 2.

Between the photodiode 3 and the transfer transistor 4, an element isolating portion 2 formed of a STI (Shallow Trench Isolation) that is a grooved portion of the semiconductor substrate 7 is formed so that the photodiode 3 and the transfer transistor 4 are isolated from each other.

The transfer transistor 4 includes gate electrodes 53 formed on the semiconductor substrate 7 and source/drain regions 5, each of which is formed on a surface of the semiconductor substrate 7 on each side of the respective gate electrodes 53.

An element isolating portion 2A is formed so that the photodiode 3 is isolated from another photodiode 3 contained in the pixel cell 96 adjacent to the pixel cell 96 containing the photodiode 3.

Figure 4:
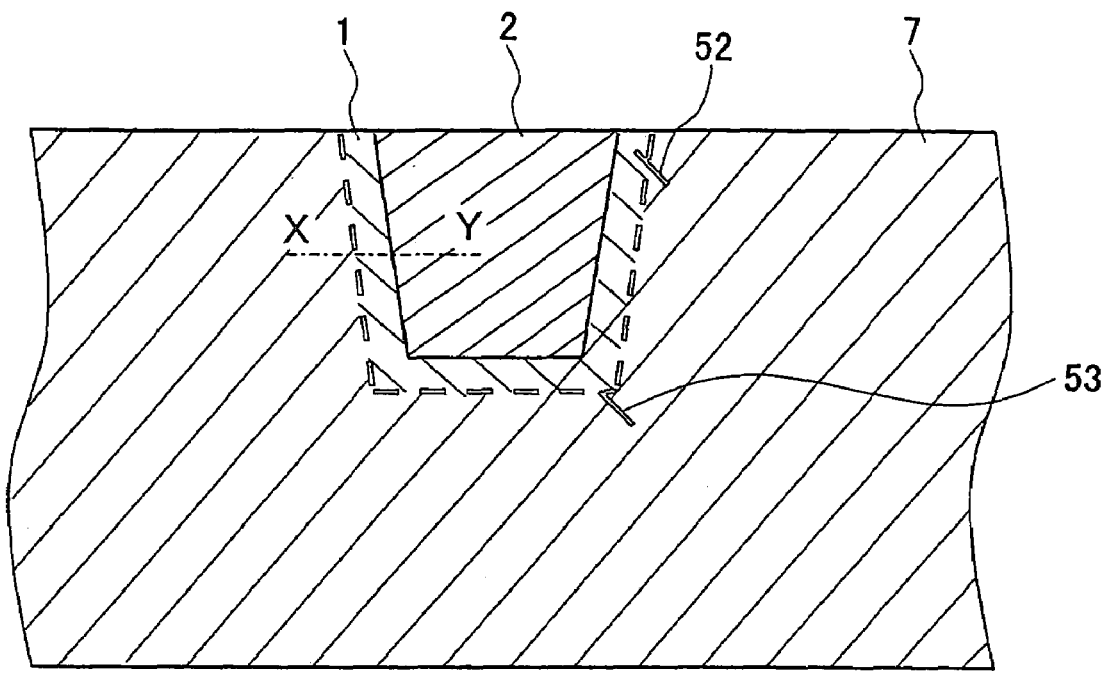
FIG. 4 is a cross sectional view for explaining a configuration of an element isolating portion and a STI leakage stopper that are provided in the pixel cell of the solid-state imaging device according to the embodiment of the present invention.
Figure 5:
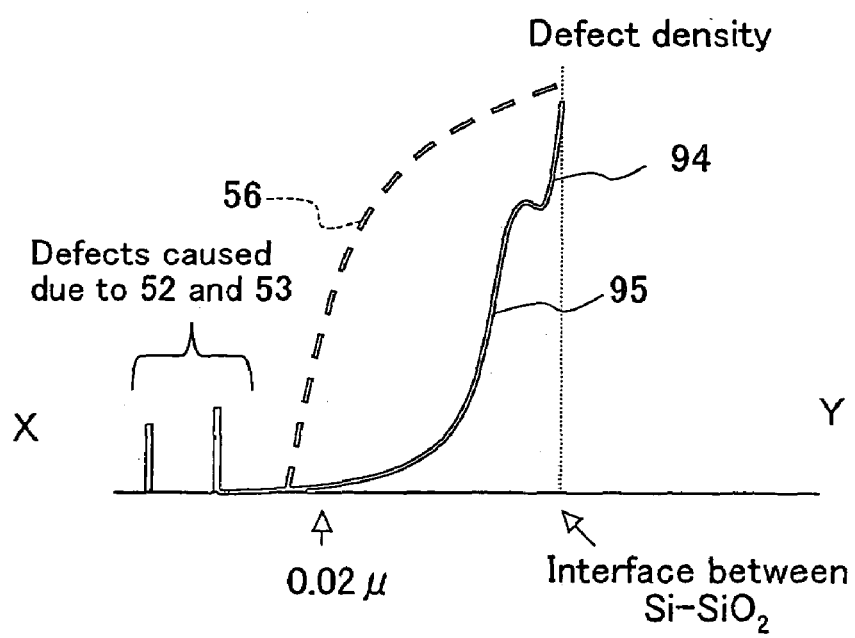
FIG. 5 is a graph showing a defect density obtained along a plane XY shown in FIG. 4.
Figure 6:
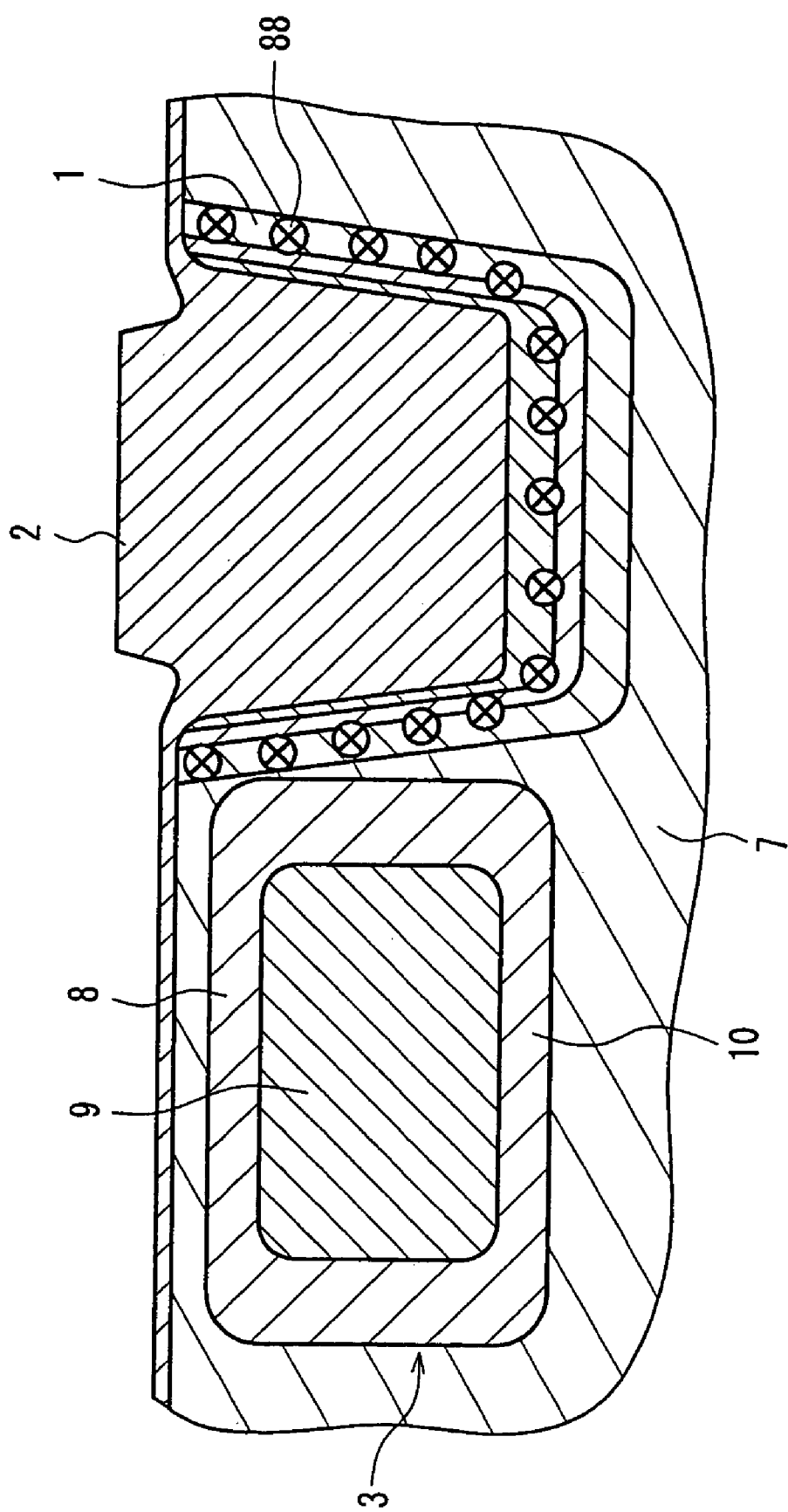
FIG. 6 is a schematic diagram for explaining a configuration of the element isolating portion, the STI leakage stopper and the photodiode that are provided in the pixel cell of the solid-state imaging device according to the embodiment of the present invention.

FIG. 4 is a cross sectional view for explaining a configuration of the element isolating portion 2 and a STI leakage stopper 1 that are provided in the pixel cell 6 of the solid-state imaging device 100 according to this embodiment. FIG. 5 is a graph showing a defect density obtained along a plane XY shown in FIG. 4. FIG. 6 is a schematic sectional view for explaining a configuration of the element isolating portion 2, the STI leakage stopper 1 and the photodiode 3.

In the semiconductor substrate 7, the STI leakage stopper 1 is formed to enclose side walls and a bottom face of the element isolating portion 2. In the STI leakage stopper 1, an impurity of a conductive type opposite to a conductive type of the source/drain regions 5 in the transfer transistor 4, which were described above with reference to FIGS. 2 and 3, is introduced. The STI leakage stopper 1 is set to have a thickness of not less than 0.01 μm. In the case where the STI leakage stopper 1 has a thickness of not less than 0.01 μm, as shown in FIG. 5, it is possible to cover a STI stress defect layer 95 almost entirely.

It is more preferable that the STI leakage stopper 1 has a thickness of not less than 0.02 μm because as indicated by a broken line 56 in FIG. 5, this allows the STI stress defect layer 95 to be covered entirely.

The photodiode 3 is an embedded photodiode in which a p+ layer 8, an n layer 9 and a p layer 10 are formed in this order starting from a surface side of the semiconductor substrate 7. Preferably, the STI leakage stopper 1 is formed so as to be linked to the p+ layer 8 of the photodiode 3. This is preferable because in the case where the STI leakage stopper 1 is isolated physically from the p+ layer 8 of the photodiode 3, a pn junction reverse-direction leakage current might be generated from a portion where these two are isolated from each other. Further, in the case where the STI leakage stopper 1 is not coupled electrically to the p+ layer 8 of the photodiode 3, since the p+ layer 8 of the embedded photodiode is suspended electrically, it is impossible to fix a voltage electrically. That is, the value of the applied voltage cannot be determined, which is a hindrance to electrical designing. Further, it is expected that the capacity of the photodiode 3 is decreased, resulting in a problem of a decrease in the saturation level.

As described above, by covering the STI stress defect layer 95 with the STI leakage stopper 1, as shown in FIG. 6, a pn junction reverse-direction leakage current that is generated from around the element isolating portion 2 can be suppressed. Thus, a high-performance MOS type solid-state imaging device can be realized. In FIG. 6, numeral 88 denotes a STI stress defect layer.

Since CMOS logics have been in the mainstream of semiconductors in recent years, in many cases, MOS type solid-state imaging devices are formed using CMOS logics. Manufacturing a CMOS logic takes a long series of process steps that are determined by a microfabrication technique, and thus it is extremely difficult to change the process steps according to a type of a sensor. Particularly, in the process steps of manufacturing a microfabricated CMOS logic, a p-type channel transistor hardly can be operated. This is because boron that is a p-type impurity is light in mass and thus is likely to move, so that the formation thereof hardly can achieve a size reduction in an inner portion of a semiconductor.

Therefore, particularly, in creating a manufacturing process specific to a sensor using microfabricated transistors, it is advantageous that circuits are formed only of an NMOS transistor. In the case of using circuits formed only of an NMOS transistor, generally, the power consumption is increased compared with the case of a CMOS transistor. Thus, in this case, an NMOS dynamic logic circuit is used. The NMOS dynamic logic circuit performs an operation referred to as booting in which a voltage is boosted using the capacity of MOS. However, a portion defining this MOS capacity also fails to operate when a leakage current is increased. That is, this presents exactly the same necessity for achieving the object of the present invention that is to reduce a leakage current. Particularly, solid-state imaging elements that recently have been applied to digital still cameras have an operation mode of performing long-time exposure that is an extremely slow operation. Therefore, in an NMOS dynamic logic, it also is essential that an element isolating portion is formed so as to achieve a reduction in leakage current.

Figure 7:
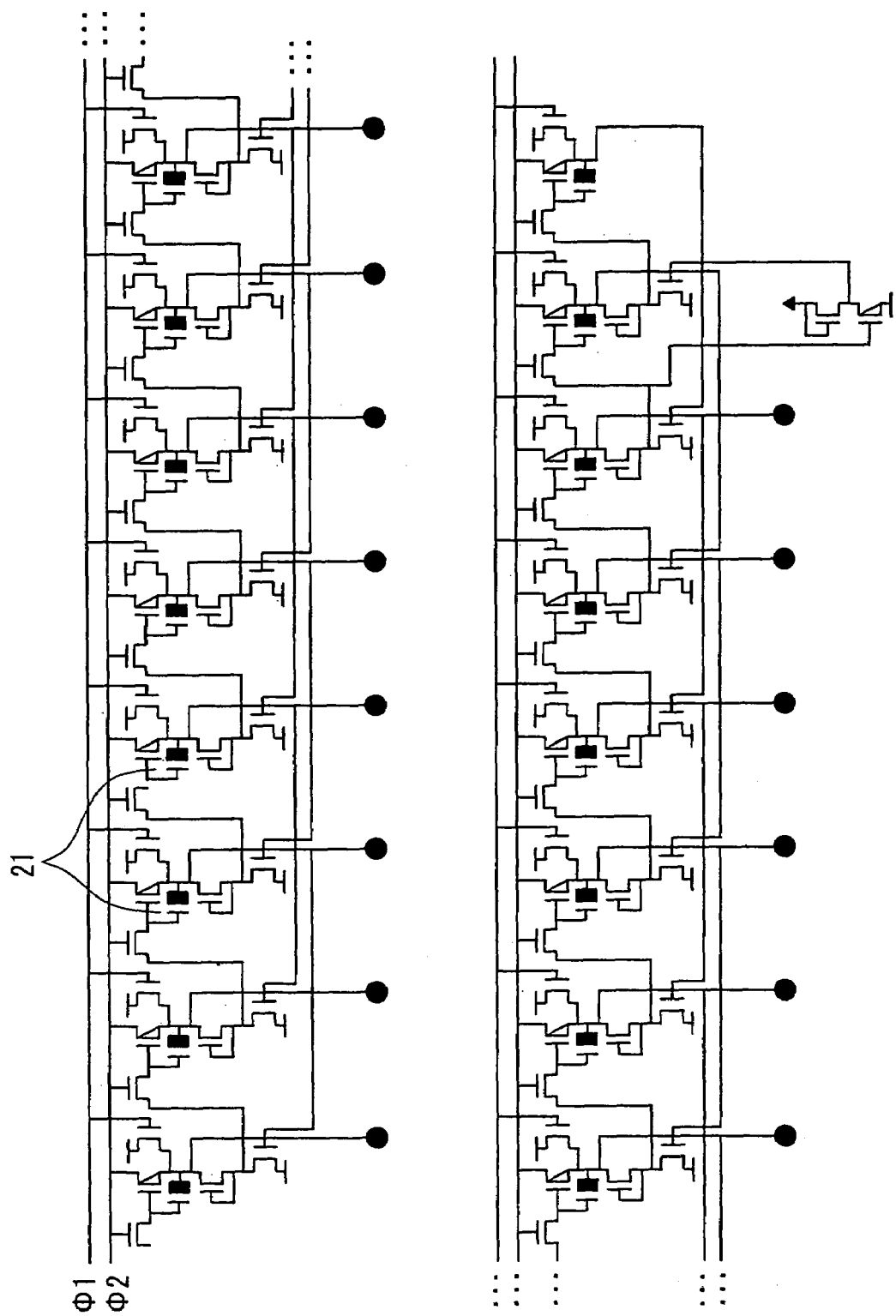
FIG. 7 is a circuit diagram showing a NMOS dynamic logic circuit that is formed of a NMOS transistor and provided in the solid-state imaging device according to the embodiment of the present invention.

FIG. 7 shows an example of a shift register circuit formed of a dynamic logic circuit. Though the description will be made without going into further details of an operation, it is noted herein that when MOS capacities 21 have a large leakage current, a slow operation cannot be achieved. It is highly effective to apply the element-isolating method according to the present invention to the element isolation in the case of the MOS capacities 21.

That is, when a solid-state imaging device is microfabricated, a dynamic logic circuit for attaining a CMOS-level low power consumption is designed by forming circuits only of an N-ch MOS transistor without using a p-ch transistor that hinders the microfabrication of transistors. In this case, in order to establish low leak technologies for achieving higher performance such as element isolation and the like, it also is essential to reduce a leakage current. A microfabricated transistor, a MOS in which circuits are formed only of an n channel transistor, an element-isolating method achieving a reduction in leakage current, and a dynamic logic have been the most important keys to the achievement of a high-performance solid-state imaging device.

The present invention is effective when adopted in the case where an element isolating portion forms a STI (Shallow Trench Isolation) and a design rule of not more than 0.25 μm is employed. A design rule of a value above 0.25 μm leads to an increase in leakage current.

Figure 8:
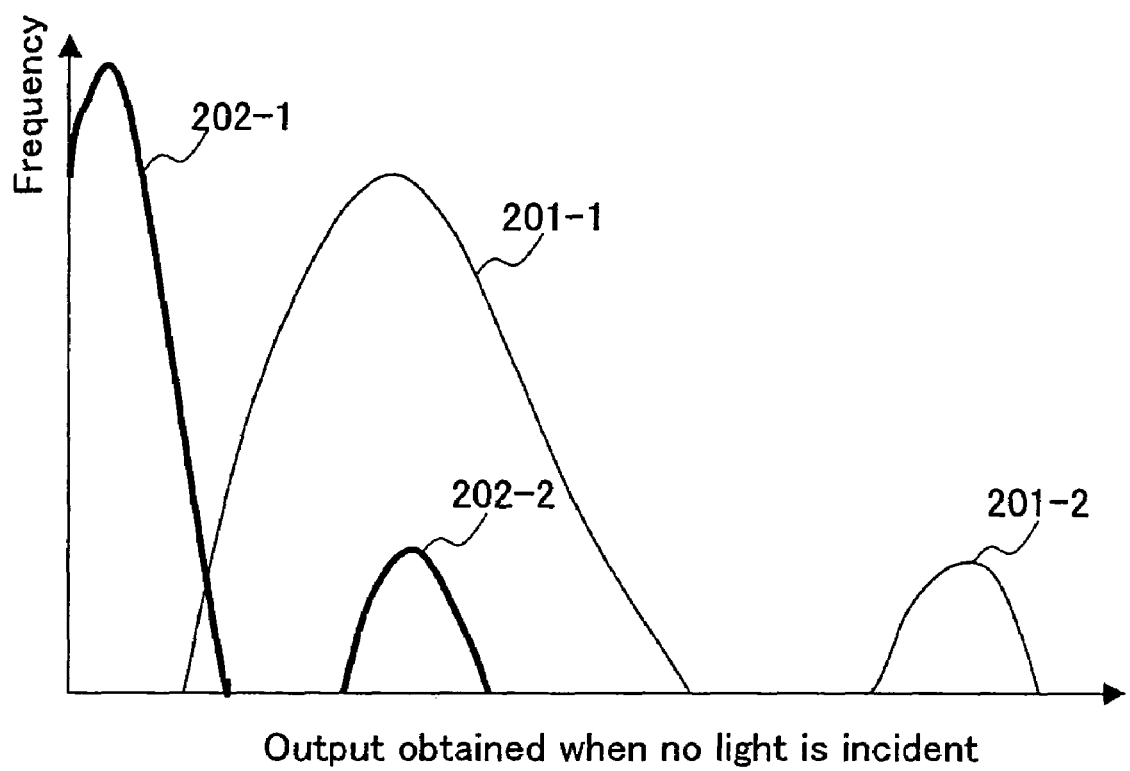
FIG. 8 is a graph showing a relationship between an output and a frequency in the pixel cell of the solid-state imaging device according to the embodiment of the present invention when no light is incident thereon.

FIG. 8 is a graph showing a relationship between an output and a frequency in the pixel cell 6 of the solid-state imaging device 100 according to this embodiment when no light is incident thereon.

The horizontal axis indicates an output obtained when no light is incident, and the vertical axis indicates a frequency with which an output having a value on the horizontal axis is produced. Each of a curve 201-1 and a curve 201-2 shows a distribution of a frequency of an output obtained in the case without the STI leakage stopper 1. The curve 201-1 shows a result that represents the case in which variations (unevenness) appear on a reproducing screen and is obtained conceivably due to the STI stress defect layer 95 shown in FIG. 5. The curve 201-2 shows a result obtained due to the large defects 52 and 53 of a STI shown in FIG. 5.

As indicated by a curve 202-1, conceivably, in the case where the STI leakage stopper 1 is formed, a leakage current is reduced more than in the case indicated by the curve 201-1. A curve 202-2 is observed in substantially the same position as that of the curve 201-1. It is unknown whether the curve 202-2 is obtained as a remaining form of the curve 201-1 or as a new curve resulting from the introduction of the STI leakage stopper 1. Even in the case where the STI leakage stopper 1 is introduced, defects with large output remain as indicated by the curve 201-2. This is reasonable because such defects cannot be suppressed as can be inferred from the intended use of the STI leakage stopper 1. The data plotted in the graph of FIG. 8 is obtained in the case where the STI leakage stopper 1 has an impurity peak concentration of $1 \times E^{17}$ cm$^{-3}$. With the impurity concentration increased to $5 \times E^{18}$ cm$^{-3}$, the curve 202-2 disappears. Even in the case where the STI leakage stopper 1 has a concentration of $1 \times E^{17}$ cm$^{-3}$ and the curve 202-2 remains, defects indicated by the curve 202-2 are low in number as in the case indicated by the curve 201-2 and thus can be corrected by a system of a digital camera, leading to no substantial problem. It should depend on the specification by a user whether the STI leakage stopper 1 is set to have an impurity concentration of about $1 \times E^{17}$ cm$^{-3}$ or not less than $5 \times E^{18}$ cm$^{-3}$.

Figure 9:
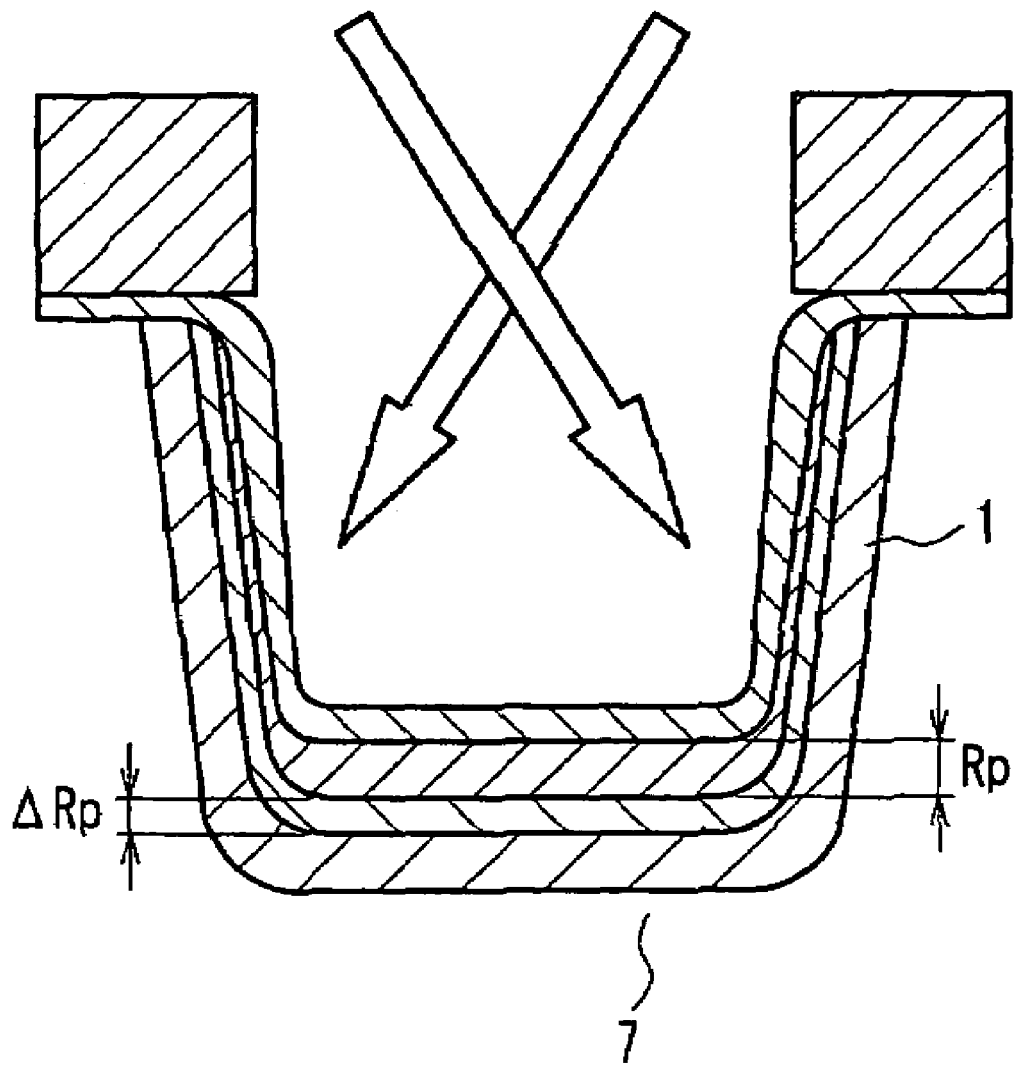
FIG. 9 is a schematic sectional view for explaining a process step of implanting ions to form the STI leakage stopper in a method of manufacturing a solid-state imaging device according to the embodiment of the present invention.
Figure 10:
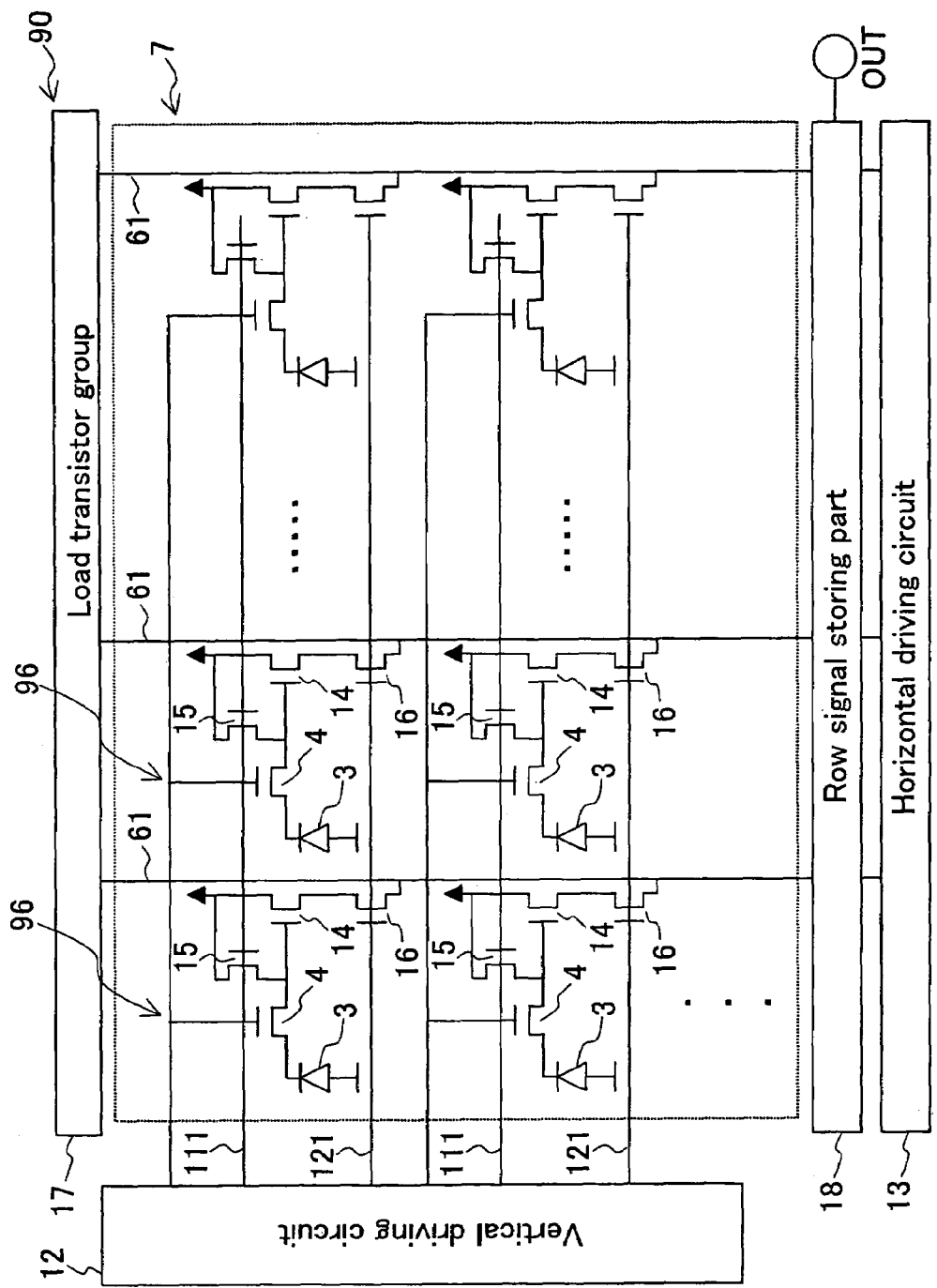
FIG. 10 is a circuit diagram showing a configuration of a conventional solid-state imaging device.
Figure 11:
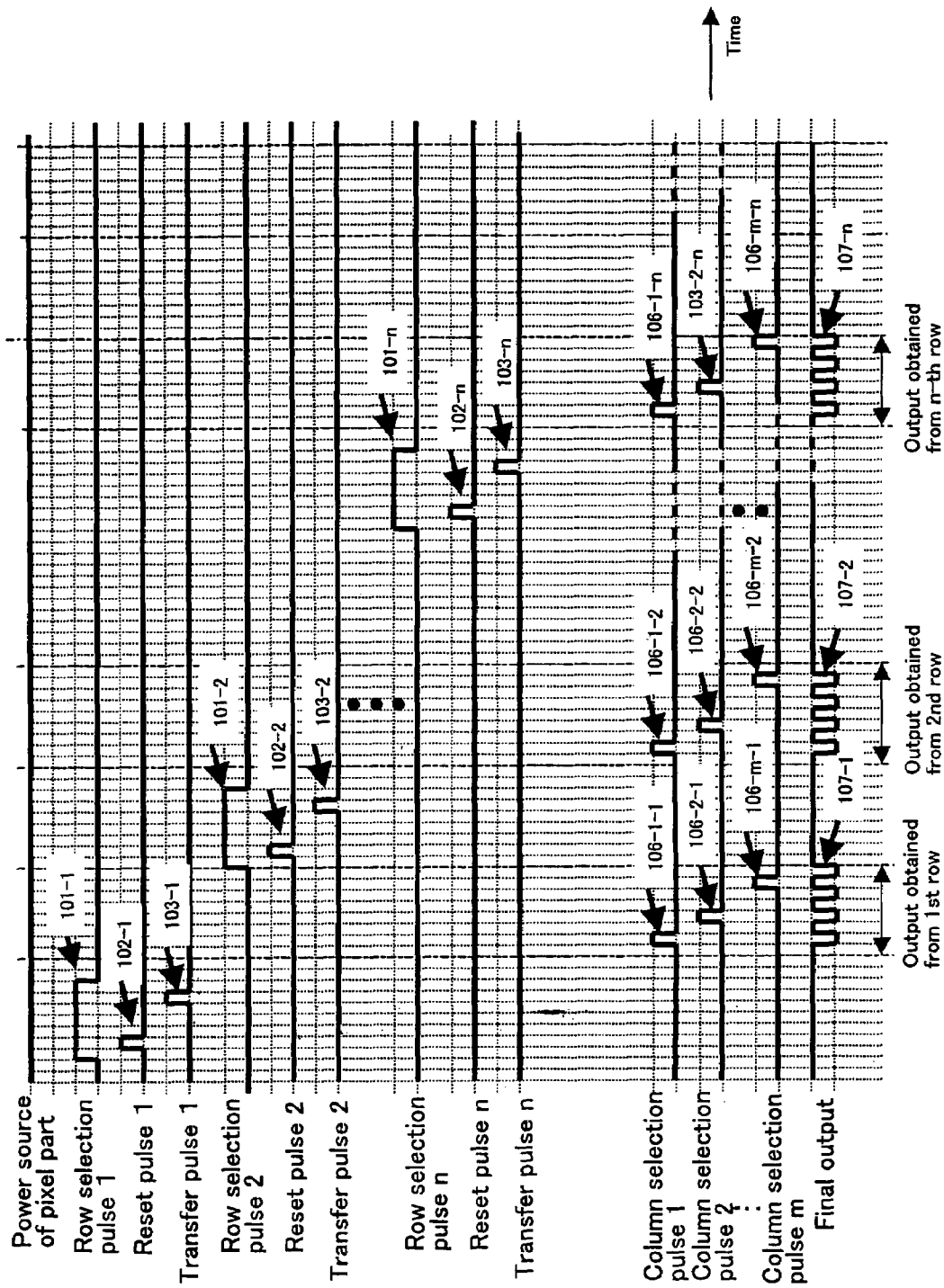
FIG. 11 is a timing chart for explaining an operation of the conventional solid-state imaging device.
Figure 12:
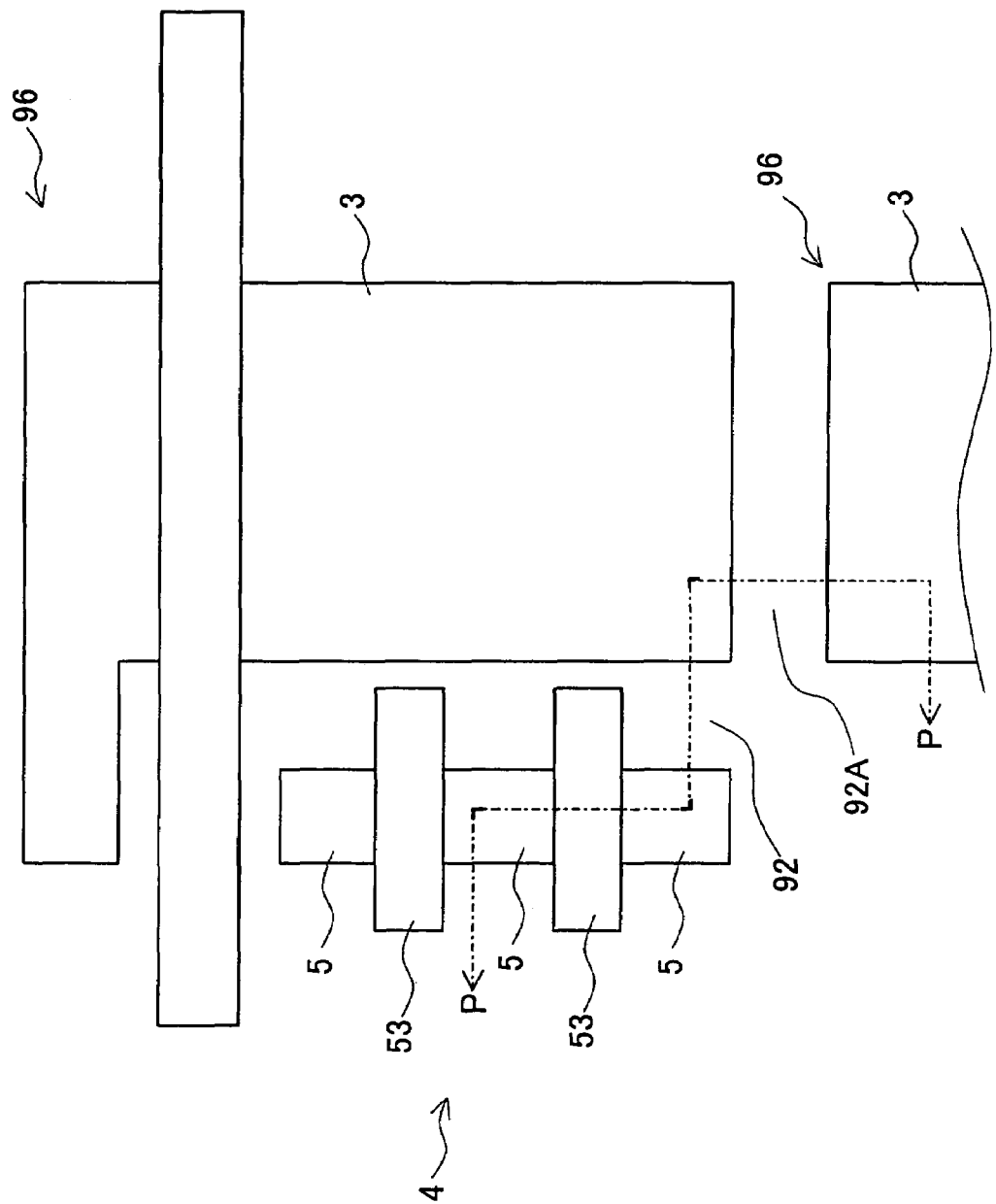
FIG. 12 is a plan view for explaining a configuration of a photodiode and a transfer transistor that are provided in a pixel cell of the conventional solid-state imaging device.
Figure 13:
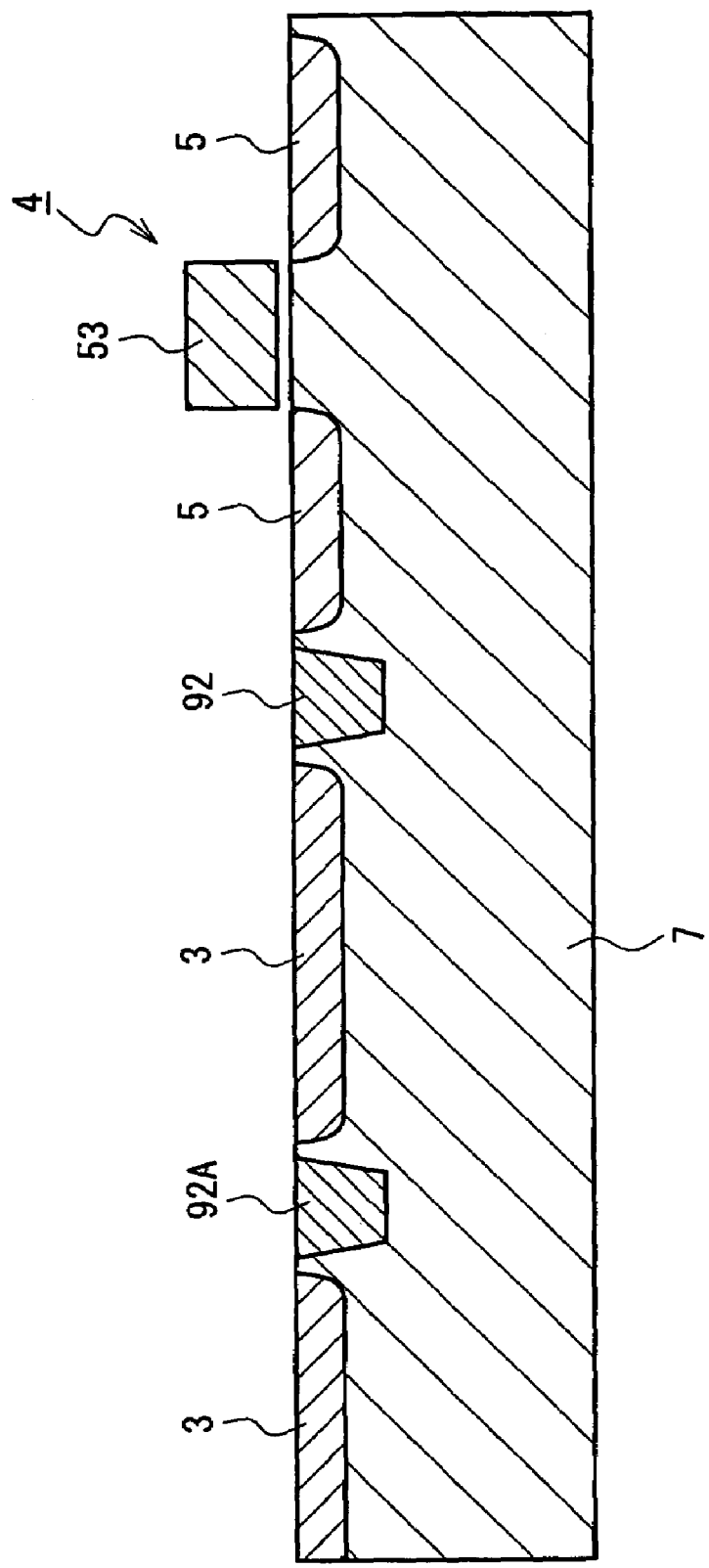
FIG. 13 is a cross sectional view taken along a plane PP shown in FIG. 12.
Figure 14:
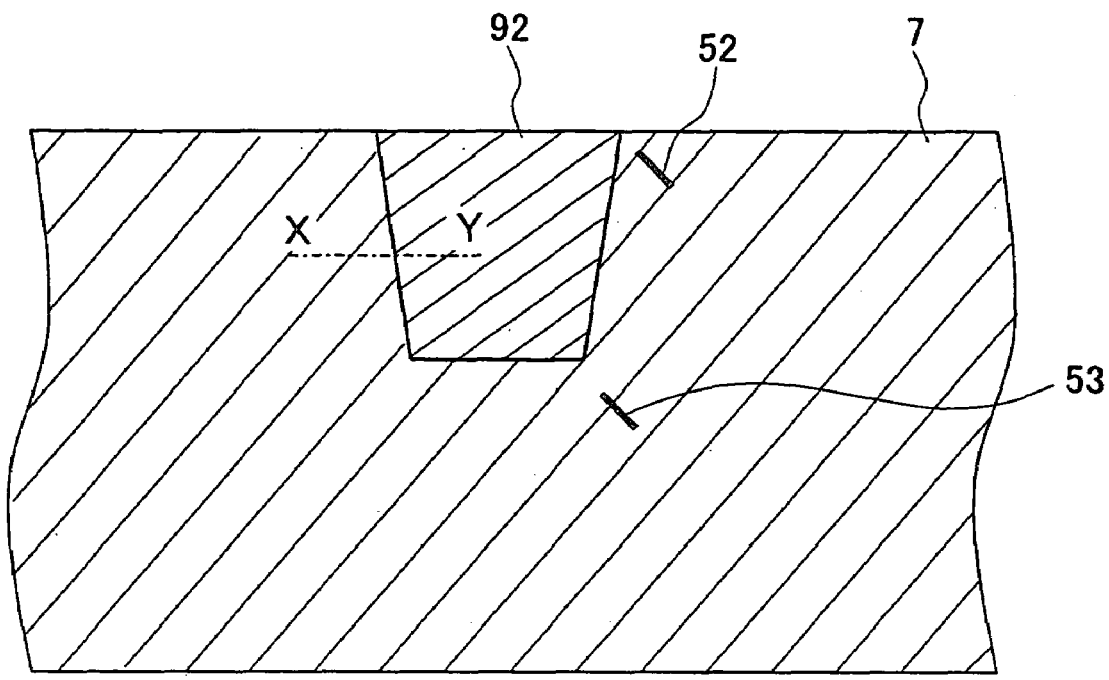
FIG. 14 is a cross sectional view for explaining a configuration of an element isolating portion provided in the pixel cell of the conventional solid-state imaging device.
Figure 15:
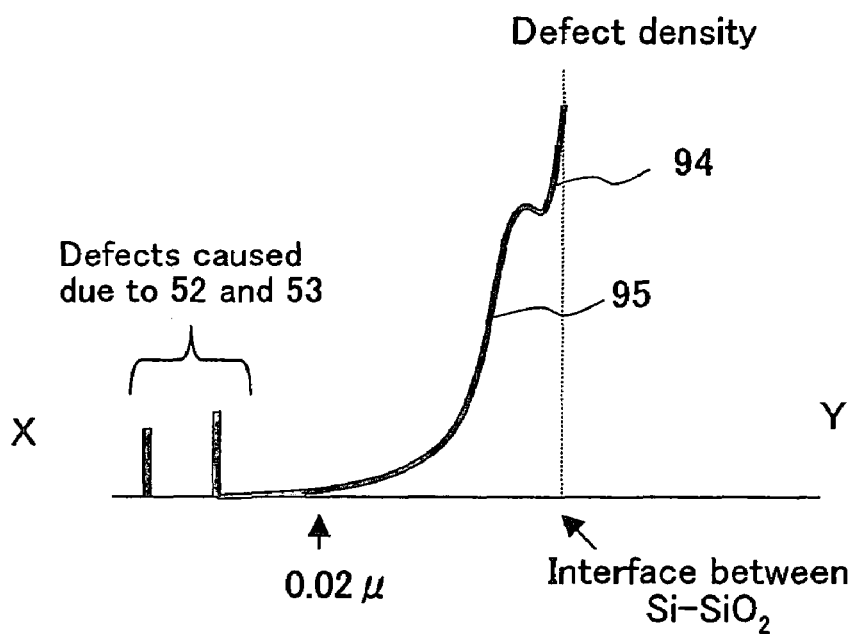
FIG. 15 is a graph showing a defect density obtained along a plane XY shown in FIG. 14.
Figure 16:
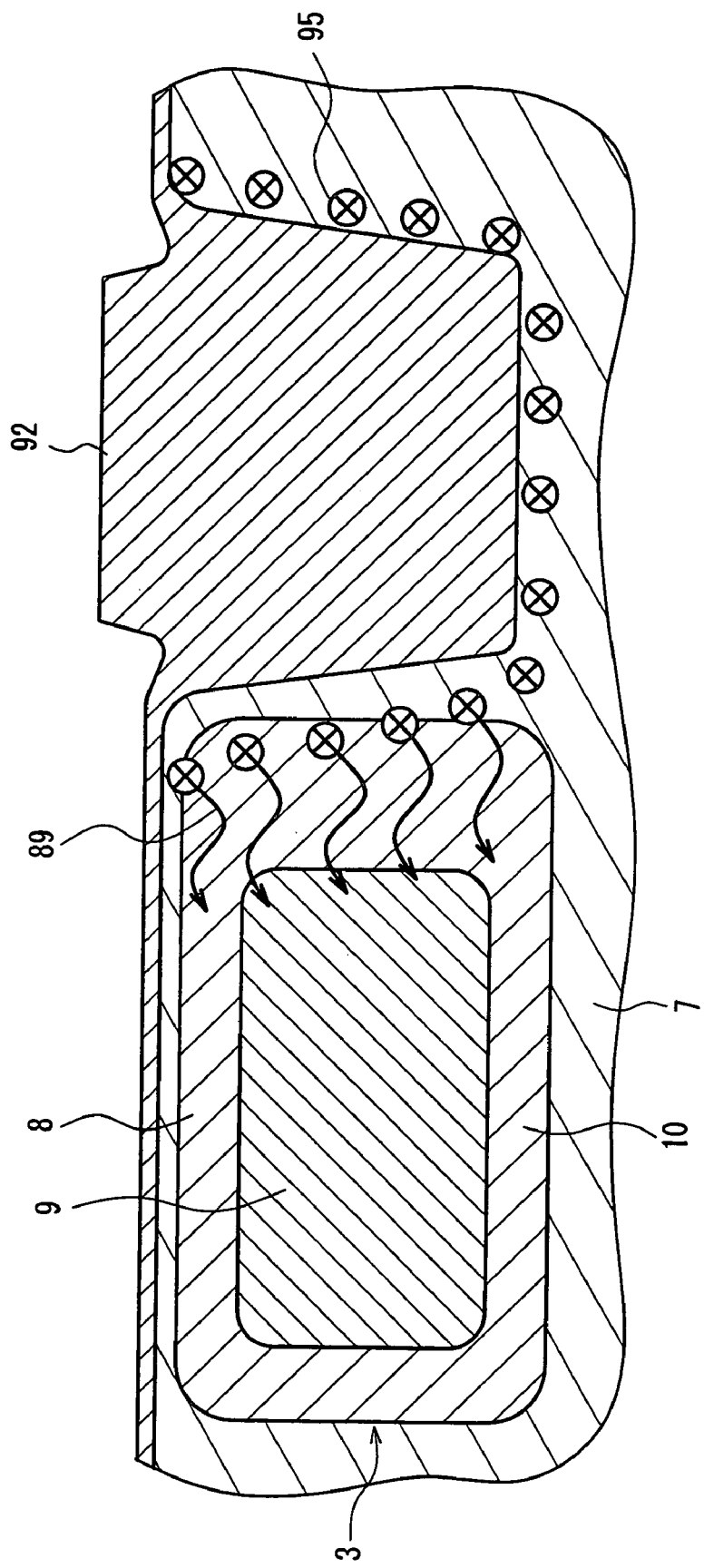
FIG. 16 is a schematic diagram for explaining a configuration of the element isolating portion and the photodiode that are provided in the pixel cell of the conventional solid-state imaging device.

FIG. 9 is a schematic sectional view for explaining a process step of implanting ions to form the STI leakage stopper 1 in the method of manufacturing the solid-state imaging device 100 according to this embodiment.

First, a groove is formed by grooving the semiconductor substrate 7 so that the photodiode 3 and the transfer transistor 4 are isolated from each other. Then, as shown in FIG. 9, ions are implanted into the groove thus formed along a direction oblique to the surface of the semiconductor substrate 7 so that the STI leakage stopper 1 is formed to enclose side walls and a bottom face of the groove.

Next, the element isolating portion 2 formed of a STI is formed in the groove. After that, the photodiode 3 is formed on the semiconductor substrate 7. Then, the transfer transistor 4 is formed on the semiconductor substrate 7 in such a manner as to be isolated from the photodiode 3 by the element isolating portion 2.

The ions implanted into the groove are of the same conductive type as that of the semiconductor substrate 7. The ions are implanted in this manner, and thus naturally, the STI leakage stopper 1 is introduced also to the bottom face of the groove at the same time as to the side walls of the groove. Due to the angle at which the ions are implanted, generally, a STI leakage stopper is formed so as to be thicker at a bottom face of a STI.

As described in the foregoing discussion, according to the present invention, a high-performance solid-state imaging device that achieves a reduction in variations appearing on a reproducing screen and a method of manufacturing the same can be provided.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solid-state imaging device, comprising:
a plurality of pixel cells that are laid out in matrix form on a semiconductor substrate; and
a driving unit that is provided to drive the plurality of pixel cells,
wherein each of the plurality of pixel cells includes:
a photodiode that converts incident light into a signal charge and stores the signal charge;
at least one MOS transistor that is provided to read out the signal charge stored in the photodiode; and
an element isolating portion that is formed so that the photodiode and each of the at least one MOS transistor are isolated from each other, the element isolating portion being formed of a STI (Shallow Trench Isolation) that is a grooved portion of the semiconductor substrate,
in the semiconductor substrate, a STI leakage stopper in which an impurity of a conductive type opposite to a conductive type of source/drain regions in the at least one MOS transistor is introduced is formed to enclose side walls and a bottom face of the element isolating portion forming the grooved portion, and
a pn junction comprising the photodiode is positoined so as to be separate from the STI leakage stopper formed along the side walls and the bottom face of the element isolating portion.

2. The solid-state imaging device according to claim 1, wherein the element isolating portion is formed so as to isolate the photodiode from another photodiode contained in a pixel cell adjacent to one of the plurality of pixel cells containing the photodiode.

3. The solid-state imaging device according to claim 1, wherein the at least one MOS transistor is a plurality of MOS transistors, and
the element isolating portion is formed so that one of the plurality of MOS transistors is isolated from another one of the plurality of MOS transistors.

4. The solid-state imaging device according to claim 1, wherein the STI leakage stopper has a thickness of not less than 0.01 µm.

5. The solid-state imaging device according to claim 1, wherein the STI leakage stopper has a thickness of not less than 0.02 µm.

6. The solid-state imaging device according to claim 1, wherein the driving unit includes:
a vertical driving circuit that drives the plurality of pixel cells along a row direction; and
a horizontal driving circuit that drives the plurality of pixel cells along a column direction.

7. The solid-state imaging device according to claim 1, wherein the photodiode is an embedded photodiode in which a p+ layer, an n layer and a p layer are formed in this order starting from a surface side of the semiconductor substrate, and
the STI leakage stopper is formed so as to be linked to the p+ layer of the photodiode.

8. The solid-state imaging device according to claim 1, wherein a MOS transistor constituting the driving unit is an NMOS transistor.

9. The solid-state imaging device according to claim 8, wherein the NMOS transistor constituting the driving unit forms an NMOS dynamic logic circuit.

10. The solid-state imaging device according to claim 1, wherein a design rule for microfabrication of not more than 0.25 µm is used for microfabrication of the plurality of pixel cells.

11. The solid-state imaging device according to claim 1, wherein the STI leakage stopper has a thickness that is larger at the bottom face of the element isolating portion than at the side walls of the element isolating portion.

12. The solid-state imaging device according to claim 1, wherein the impurity introduced in the STI leakage stopper has a peak concentration of not less than $1\times10^{17}$ cm$^{-3}$.

13. The solid-state imaging device according to claim 1, wherein the impurity introduced in the STI leakage stopper has a peak concentration of not less than $5\times10^{18}$ cm$^{-3}$.

14. A method of manufacturing a solid-state imaging device, comprising:
   a plurality of pixel cells that are laid out in matrix form on a semiconductor substrate; and
   a driving unit that is provided to drive the plurality of pixel cells,
   wherein each of the plurality of pixel cells includes:
      a photodiode that converts incident light into a signal charge and stores the signal charge;
      at least one MOS transistor that is provided to read out the signal charge stored in the photodiode; and
      an element isolating portion that is formed so that the photodiode and each of the at least one MOS transistor are isolated from each other, the element isolating portion being formed of the STI (Shallow Trench Isolatin) that is a grooved portion of the semiconductor substrate, and
   in the semiconductor substrate, a STI leakage stopper in which an impurity of a conductive type opposite to a conductive type of source/drain regions in the at least one MOS transistor is introduced is formed to enclose side walls and a bottom face of the element isolating portion forming the grooved portion,
   the method comprising the steps of:
      forming a groove by grooving the semiconductor substrate so that the photodiode and each of the at least one MOS transistor are isolated from each other;
      implanting ions into the groove so that the STI leakage stopper is formed to enclose side walls and a bottom face of the groove;
      forming the element isolating portion formed of the STI (Shallow Trench Isolation) in the groove;
      forming the photodiode on the semiconductor substrate after the step of forming the element isolating portion; and
      forming the at least one MOS transistor on the semiconductor substrate such that each of the at least one MOS transistor is isolated from the photodiode by the element isolating portion.

* * * * *

UNITED STATES PATENT AND TRADEMARK OFFICE
CERTIFICATE OF CORRECTION

PATENT NO. : 7,060,960 B2
APPLICATION NO. : 10/727676
DATED : June 13, 2006
INVENTOR(S) : Ohta et al.

It is certified that error appears in the above-identified patent and that said Letters Patent is hereby corrected as shown below:

Column 10, line 18(claim 1): "positoined" should read --positioned--
Column 11, line 23(claim 14): "of the STI" should read --of a STI--
Cloumn 11, line 24(claim 14): "Isolatin" should read --Isolation--

Signed and Sealed this

Sixteenth Day of January, 2007

JON W. DUDAS
*Director of the United States Patent and Trademark Office*